US007851792B2

United States Patent
Aiba et al.

(10) Patent No.: US 7,851,792 B2
(45) Date of Patent: Dec. 14, 2010

(54) FIELD-EFFECT TRANSISTOR

(75) Inventors: Toshiaki Aiba, Fujisawa (JP);
Masafumi Sano, Yokohama (JP);
Nobuyuki Kaji, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 295 days.

(21) Appl. No.: 12/089,907

(22) PCT Filed: Nov. 1, 2006

(86) PCT No.: PCT/JP2006/322327

§ 371 (c)(1),
(2), (4) Date: Apr. 10, 2008

(87) PCT Pub. No.: WO2007/055256

PCT Pub. Date: May 18, 2007

(65) Prior Publication Data

US 2009/0272970 A1 Nov. 5, 2009

(30) Foreign Application Priority Data

Nov. 8, 2005 (JP) ............................. 2005-323689
Oct. 18, 2006 (JP) ............................. 2006-283893

(51) Int. Cl.
*H01L 29/786* (2006.01)
(52) U.S. Cl. ............................ 257/43; 257/52; 257/57; 257/213; 257/E29.296; 257/E29.08
(58) Field of Classification Search .................. 257/43, 257/E29.296, 52, 57, 213, E29.08
See application file for complete search history.

(56) References Cited

U.S. PATENT DOCUMENTS

| 6,123,824 A | 9/2000 | Sano et al. |
| 6,172,296 B1 | 1/2001 | Iwasaki et al. |
| 6,303,945 B1 | 10/2001 | Saito et al. |
| 6,344,608 B2 | 2/2002 | Kariya et al. |
| 6,399,873 B1 | 6/2002 | Sano et al. |
| 6,472,248 B2 | 10/2002 | Shiozaki et al. |
| 6,488,995 B1 | 12/2002 | Nishimoto et al. |
| 6,613,603 B1 | 9/2003 | Sano |

(Continued)

FOREIGN PATENT DOCUMENTS

EP 0 535 979 A2 4/1993

(Continued)

OTHER PUBLICATIONS

H. Q. Chiang, et al., "High mobility transparent thin-film transistors with amorphous zinc tin oxide channel layer", Applied Physics Letters, vol. 86, 2005, pp. 013503-1-013503-3.

(Continued)

*Primary Examiner*—Ngan Ngo
*Assistant Examiner*—Benjamin Tzu-Hung Liu
(74) *Attorney, Agent, or Firm*—Fitzpatrick, Cella, Harper & Scinto

(57) ABSTRACT

Provided is a field-effect transistor including an active layer and a gate insulating film, wherein the active layer includes an amorphous oxide layer containing an amorphous region and a crystalline region, and the crystalline region is in the vicinity of or in contact with an interface between the amorphous oxide layer and the gate insulating film.

2 Claims, 2 Drawing Sheets

U.S. PATENT DOCUMENTS

| | | |
|---|---|---|
| 6,635,899 B2 | 10/2003 | Saito et al. |
| 6,653,165 B2 | 11/2003 | Kondo et al. |
| 6,706,336 B2 | 3/2004 | Kondo et al. |
| 6,794,275 B2 | 9/2004 | Kondo et al. |
| 6,812,499 B2 | 11/2004 | Kondo et al. |
| 6,835,888 B2 | 12/2004 | Sano et al. |
| 6,855,621 B2 | 2/2005 | Kondo et al. |
| 6,858,308 B2 | 2/2005 | Kondo et al. |
| 7,001,460 B2 | 2/2006 | Saito et al. |
| 7,064,263 B2 | 6/2006 | Sano et al. |
| 7,067,844 B2 | 6/2006 | Yamazaki |
| 7,339,187 B2 | 3/2008 | Wager, III et al. |
| 2001/0014535 A1 | 8/2001 | Yamazaki et al. |
| 2004/0221887 A1 | 11/2004 | Kondo et al. |
| 2005/0017244 A1 | 1/2005 | Hoffman et al. |
| 2006/0108636 A1 | 5/2006 | Sano et al. |
| 2006/0244107 A1 | 11/2006 | Sugihara et al. |
| 2007/0090365 A1 | 4/2007 | Hayashi et al. |
| 2007/0194379 A1* | 8/2007 | Hosono et al. ............. 257/347 |

FOREIGN PATENT DOCUMENTS

| | | |
|---|---|---|
| EP | 1 551 059 | 7/2005 |
| JP | 61-87371 A | 5/1986 |
| JP | 5-95002 A | 4/1993 |
| JP | 2005-33172 A | 2/2005 |
| WO | 2005088726 | 9/2005 |
| WO | WO 2005088726 A1 * | 9/2005 |
| WO | 2006051993 | 5/2006 |

OTHER PUBLICATIONS

R. Martins, et al., "Transport in high mobility amorphous wide band gap indium zinc oxide films", Phys. Stat. Sol. (a), vol. 202, No. 9, 2005, pp. R95-R97.

PCT International Search Report and Written Opinion of the International Searching Authority, dated Jan. 24, 2007 in PCT/JP2006/322327.

PCT International Preliminary Report on Patentability, dated May 14, 2008 in PCT JP2006/322327.

Official Action dated Jul. 22, 2009 in Russian Application No. 2008122971/28(027634).

* cited by examiner

FIELD-EFFECT TRANSISTOR

TECHNICAL FIELD

The present invention relates to a field-effect transistor. In particular, the present invention relates to a field-effect transistor using an amorphous oxide for an active layer.

BACKGROUND ART

In recent years, studies have been made on a technique in which an oxide semiconductor is used for an active layer of a thin film transistor (TFT). In particular, an amorphous oxide made of InGaZn may have higher utility, in terms of a process temperature, than amorphous silicon typically used for the active layer of the TFT, because the amorphous oxide made of InGaZn can be formed to a film at a room temperature.

For example, WO 2005/088726 discloses a technique in which the amorphous oxide made of InGaZn is used for the active layer of the TFT.

Amorphous silicon is generally said to have a field-effect mobility of about 0.5 $cm^2/V \cdot s$.

Meanwhile, WO 2005/088726 mentioned above discloses an output characteristic of the TFT which employs the amorphous oxide made of InGaZn for the active layer thereof. According to WO 2005/088726, an embodiment shows that the field-effect mobility in an saturation region of the TFT is about 10 $cm^2/V \cdot s$.

However, in order to allow the amorphous oxide semiconductor to be used in place of amorphous silicon having great versatility, further improvement in its function is necessary.

DISCLOSURE OF THE INVENTION

In view of the above-mentioned circumstances, an object of the present invention is to provide a novel field-effect transistor using the amorphous oxide having a high field-effect mobility.

According to the present invention, there is provided a field-effect transistor including:

an active layer, and a gate insulating film, wherein the active layer includes an amorphous oxide layer containing an amorphous region and a crystalline region, and the crystalline region is in a vicinity of or in contact with an interface between the amorphous oxide layer and the gate insulating film.

Incidentally, the inventors of the present invention have made intensive studies, aiming at further improving the field-effect mobility. As a result of the studies, the inventors have found that a high field-effect mobility can be obtained in a case where a crystalline phase (i.e., crystalline region) is present in the vicinity of an interface with a gate insulating film in the amorphous oxide layer which becomes the active layer, and have made the present invention. Example described later shows an experiment conducted by forming two active layers, one having such the crystalline region present in the amorphous oxide, and the other having no crystalline region in the amorphous oxide. The two active layers are then compared with each other in terms of the field-effect mobility.

BEST MODE FOR CARRYING OUT THE INVENTION

Figure 2:
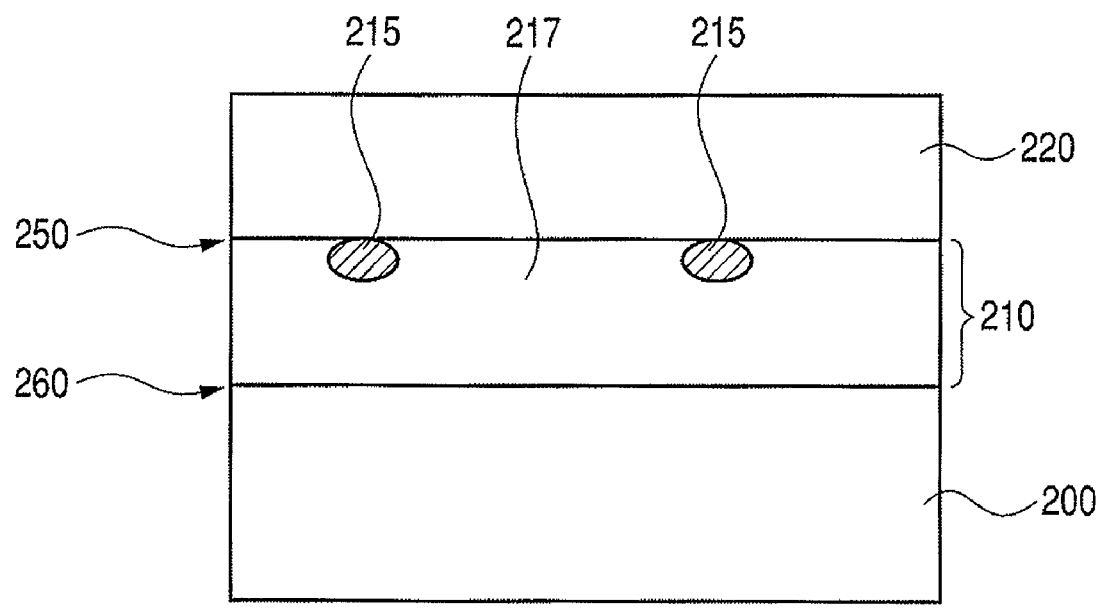
FIG. 2 is a schematic cross-sectional view for explaining the present invention.

The present invention is characterized in that an active layer 210 of a field-effect transistor is formed of an amorphous oxide layer 217 as shown in FIG. 2, and a crystalline region 215 is present in the amorphous oxide layer 217 so as to be in the vicinity of an interface with a gate insulating film 220 or in contact with the interface. In other words, the active layer 210 is composed of the amorphous region and the crystalline region, and the crystalline region 215 is present in the amorphous oxide layer so as to be in the vicinity of the interface with the gate insulating film 220 or in contact with the interface.

In Example described later, an oxide composed of In, Ga and Zn is used as an example. The crystalline region 215 mentioned above is not present in the vicinity of a second interface 260 opposed to a first interface 250 which is as an interface between the amorphous oxide and the gate insulating film.

Details on the reasons why the crystalline region or microcrystalline region is formed in the amorphous oxide, particularly at the position described above, are unclear, but are considered ascribable to a composition of the oxide, an oxygen concentration at the time of manufacturing, a deposition temperature, a material of the insulating film, or a manufacturing method.

In Example to be described later, it was confirmed that the crystalline region appeared at a specific position by changing, in particular, an oxygen atmosphere condition with respect to a specific composition at the time of producing the transistor.

In general, as regards the amorphous oxide functioning as a semiconductor, it is difficult to find out a suitable composition and production condition therefor so as to be used for the active layer of the transistor.

However, according to the present invention, the following guideline has been found. That is, it is possible to produce a transistor having a high field-effect mobility by generating the crystalline region in the vicinity of the interface or at a position in contact with the interface in the amorphous layer to form the active layer.

The reason why the crystalline region is present only in the vicinity of the interface with the gate insulating film in the present invention, without the crystalline region being dispersed in the thickness direction of the entire amorphous oxide, is assumed as follows.

Even in the amorphous oxide, as the thickness of a staked layer increases, stress may be accumulated or energy may be applied on a surface side of the amorphous oxide by formation of the insulating film. Further, depending on the composition of the amorphous oxide, crystallization may be likely to occur, or in contrast, may be unlikely to occur. The composition of the amorphous oxide shown in Example to be described later may be just close to the composition which easily causes crystallization. This is the reason why the crystalline region is present only in the vicinity of the interface with the gate insulating film.

That is, as film formation proceeds, the properties (surface condition, electrical conductivity, thermal conductivity and the like) of a film change, and thereby the possibility of nucleation for crystal growth on a film surface becomes high to easily cause crystallization in some cases. Even when an original film has an amorphous structure, it is considered that an amorphous structure closer to a crystal has a higher possibility of causing the above-described phenomenon (in which crystallization starts on the way of film formation).

According to the present invention, the crystalline region exists "at an interface with or in a vicinity of" the gate insulating film, and thereby a region for forming a channel in an active layer on the gate insulating film side becomes an amorphous structure closer to a crystalline structure among the amorphous structure. Because of having such specific structure, although it is amorphous, it is possible to obtain an amorphous structure having excellent characteristics closer to the characteristics of a crystal. On the other hand, because the crystalline region exists substantially in a dotted state, the almost part of a channel path is an amorphous region, and therefore it is considered that the mobility reduction due to a grain boundary can be prevented.

On the contrary, the crystalline region exists in a region composite to the region "at an interface with or in a vicinity of" the gate insulating film, and thereby a region for forming a channel in the active layer on the gate insulating film side does not always become an amorphous structure closer to a crystalline structure among the amorphous structure. Accordingly, it is considered that it is not always possible to obtain an amorphous structure having excellent characteristics closer to the characteristics of a crystal.

In the case where a polycrystal or a microcrystal exists in the whole active layer, which is different from the present invention, it is considered that the mobility is reduced because a grain boundary exists. Particularly, it is considered that, as the grain size of a crystal increases, there arises a problem that crystal orientation dependency on each of characteristics exists to reduce the uniformity of the characteristics.

According to the present invention, the method of forming a crystalline region only "at an interface with or in a vicinity of" the gate insulating film includes a method of forming a crystalline region in a self-matching manner without intentionally changing film formation conditions during film formation, a method of forming a crystalline region with intentionally changing film formation conditions during film formation, and the like. However, if formation of the crystal formation and the like are inconvenient, the method is not particularly limited.

The method of forming a crystalline region in a self-matching manner without intentionally changing film formation conditions during film formation utilizes a case where, as film formation proceeds, properties (surface condition, electrical conductivity, thermal conductivity and the like) of a film change to easily cause crystallization. For example, although film formation conditions are not changed during film formation, as film formation proceeds, control of the crystallization-proceeding conditions (film property-changing conditions) makes it possible to form a crystalline region only "at an interface with or in a vicinity of" the gate insulating film.

The method of forming a crystalline region with intentionally changing film formation conditions during film formation utilizes film formation conditions such as a substrate temperature, a film formation rate, a film formation power. That is, the film formation conditions for easy crystallization are to increase the substrate temperature, decrease the film formation rate, reduce a power at time of film formation, and the like. Thus intentional change of the film formation conditions during film formation makes it possible to form a crystalline region only "at an interface with or in a vicinity of" the gate insulating film. Since these conditions are different depending on conditions such as the constitution of a film formation apparatus, it is important to previously conduct a sample film formation, obtain the relation between film formation conditions and the crystallization state of a deposited film, and control these conditions on the basis of the obtained results.

The amorphous oxide used in the present invention contains, for example, In, Zn and Ga.

The crystalline region represents a crystalline region of the active layer observed by a cross-sectional transmission electron microscope (TEM) technique.

The field-effect transistors according to the present invention include not only a stagger type and an inverted stagger type, but also a coplanar type and an inverted coplanar type.

A thickness of the amorphous oxide layer serving as the active layer according to the present invention may preferably be 0.05 µm or more and 1 µm or less.

The thickness of the amorphous oxide layer is determined according to the following reasons. The crystalline region according to the present invention has a cross sectional diameter of less than 0.05 µm. Therefore, when the active layer has a thickness of less than 0.05 µm, there occurs a great difference in performance between a TFT including the crystalline region in its channel and a TFT including no crystalline region in its channel. Further, when the thickness is more than 1 µm, the amorphous oxide layer requires a long time for its film formation, the thickness of more than 1 µm is unsuitable for mass production process.

In a case of using the active layer formed of the amorphous oxide having the crystalline region in the vicinity of the interface with the gate insulating film, it is preferable to produce the transistor such that a portion serving as a channel of the transistor does not include such the crystalline region in view of eliminating the difference in performance between transistors.

Further, in the present invention, after forming the amorphous oxide layer according to the present invention, it is also possible to remove at least a part of a region containing a crystalline region which exists in a surface layer portion of the amorphous oxide layer, as occasion demands. When another layer is formed on the amorphous oxide layer, this treatment can control the existence amount and distribution state of the crystalline region existing on an interface between the layers to thereby enhance the matching of the interface.

The "the vicinity of an interface" in the present invention means a region within a distance of ½ of the thickness of the active layer from the interface, although it depends on the thickness of the active layer, and within 300 nm, preferably 100 nm, and more preferably 50 nm from the interface between the active layer and the gate insulating layer.

Additionally, it is considered that, when the thickness of the vicinity of the interface in the present invention is a region having a thickness equal to or more than the thickness of the channel, the present invention becomes more effective.

Example

A specific method of producing the field-effect transistor according to the present invention will be explained.

(1) Production of Active Layer

First, a $SiO_2$ glass substrate (1737 manufactured by Corning Incorporated) was prepared as a substrate on which a film is to be deposited. Then, an amorphous oxide layer composed of In, Zn, and Ga was formed by an RF sputtering method.

Herein, a polycrystalline sintered body of InGaZn oxide was used as a target material. SH-350 (manufactured by ULVAC, Inc.) in which a plurality of target substrates can be placed was used as an RF sputtering apparatus. RF power was set to 300 W, a film formation pressure (i.e., total pressure) was set to 4 mTorr (i.e., about 0.533 Pa), and a substrate temperature was not particularly increased.

A film formation atmosphere was made to be a mixed gas atmosphere of oxygen and argon. An oxygen partial pressure was set to 3.7% (i.e., about 0.0197 Pa) in flow rate. A distance between the target and the substrate was set to about 5 cm in a vertical direction, and film formation was performed. The film formation was finished at the time when the thickness of the amorphous oxide layer became 50 nm.

The composition of the obtained amorphous oxide layer was In:Ga:Zn=1:0.9:0.65 by X-ray fluorescence analysis.

(2) Production of MISFET

Figure 3:
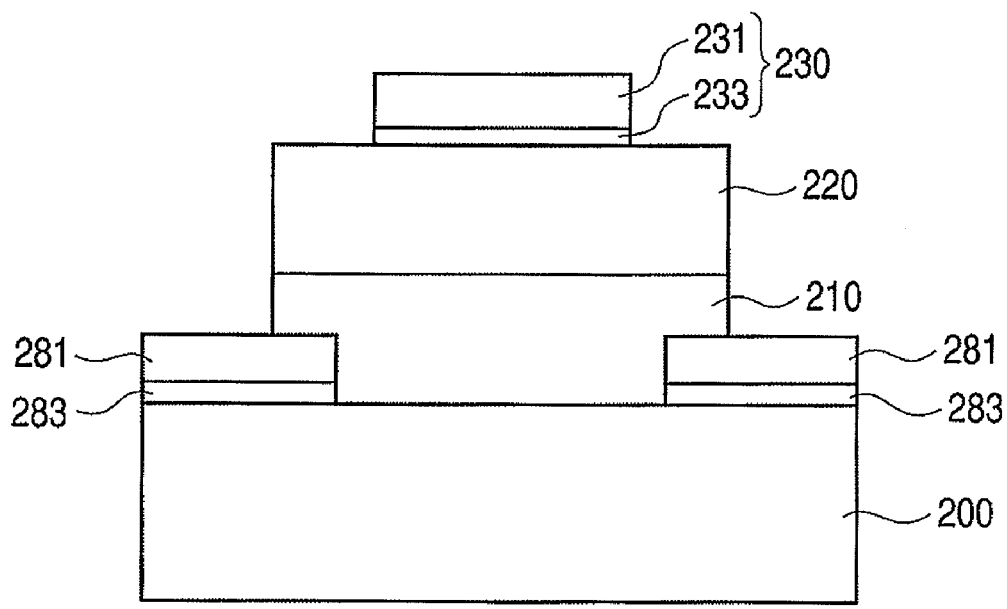
FIG. 3 is a schematic cross-sectional view for explaining a field-effect transistor according to the present invention.

Next, a top-gate MISFET device shown in FIG. 3 was produced. The transistor was produced such that a channel length and a channel width were set to 10 μm and 150 μm, respectively.

On the substrate, a Ti film (film thickness: 5 nm) 283 and an Au film (film thickness: 40 nm) 281 were formed in the stated order by electron beam deposition method, and then subjected to patterning to have a pattern shown in FIG. 3. As a result, a source electrode and a drain electrode were formed. After that, a resist (not shown) which was subjected to patterning was formed on a part of both the electrodes, and the amorphous oxide layer 210 was provided by the RF sputtering method. After that, a $Y_2O_3$ film 220 for functioning as the gate insulating layer was formed (film thickness: 140 nm) by the RF sputtering method as mentioned above.

After lift-off was performed through resist removal, a resist was formed again, patterning was performed, and then a gate electrode 230 composed of a Ti film 233 and an Au film 231 was formed in the same way as the drain electrode and the like. As a result, the top-gate TFT can be obtained. The formation of the electrodes and the gate insulating film was performed in a state where heating was not particularly carried out. A structure of the gate electrode 230 was the same as that of the source electrode.

(3) Characteristic Evaluation and Structure Evaluation of MISFET

A current-voltage characteristic of the TFT thus produced was determined at a room temperature. As a drain voltage $V_{DS}$ increased, a drain current $I_{DS}$ increased, and this indicates that the channel is an n-type semiconductor. Further, behavior of a typical semiconductor transistor was shown in which a pinch-off (saturated) state occurred when the drain voltage $V_{DS}$ reached about 6 V. When a gain characteristic was examined, a threshold of a gate voltage $V_{GS}$ at the time of applying the drain voltage $V_{DS}$ of 6 V was about +1 V. In addition, the drain current $I_{DS}$ of $7.5 \times 10^{-5}$ A flowed when the gate voltage $V_{GS}$ was 4 V.

An on/off ratio of the transistor exceeded $10^6$. The field-effect mobility was calculated from the output characteristic in the saturated region to be about 15.7 cm²/V·s, thereby obtaining a high field-effect mobility.

Figure 1:
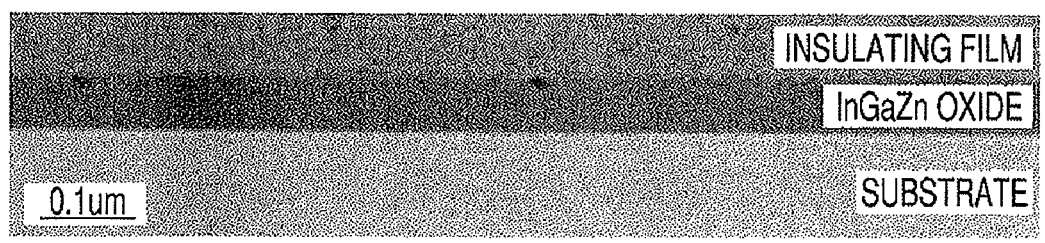
FIG. 1 is a cross-sectional TEM image for explaining the present invention.

Then, the transistor having such the high field-effect mobility was observed by the cross-sectional TEM technique. To be specific, the cross section of the transistor was formed using FIB (FB-2000 manufactured by Hitachi, Ltd. was used), and was observed by the cross-sectional TEM technique. For the observation, H-800 manufactured by Hitachi, Ltd. was used. FIG. 1 shows a cross-sectional TEM image thereof. In FIG. 1, an InGaZn oxide layer is located between the substrate and the insulating film. Further, the oxide layer includes crystal grains in or around the vicinity of the interface with the insulating film.

(4) Comparative Example

Figure 4:
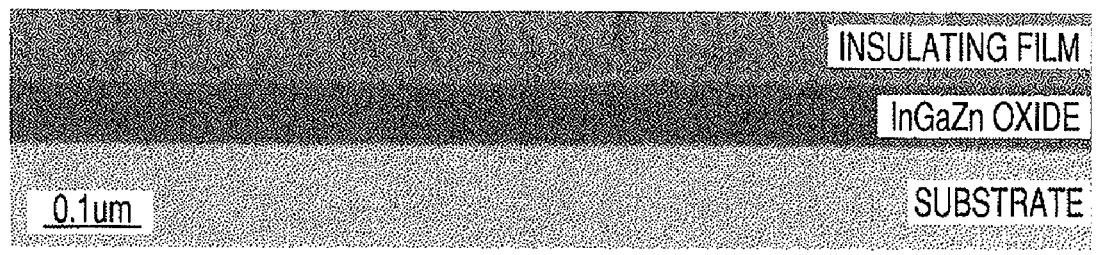
FIG. 4 is a cross-sectional TEM image for explaining Comparative Example.

For comparison with the above Example, the transistor was produced under the same conditions as in Example except that an oxygen partial pressure at the time of forming an amorphous oxide layer was changed to 3.4% (i.e., 0.018 Pa). The transistor was observed by the cross-sectional TEM technique mentioned above. As shown in FIG. 4, a crystalline region was not present in the amorphous oxide layer. The composition of the active layer was almost the same as that of the above Example.

A transistor characteristic was evaluated to reveal that a field-effect mobility was about 10 cm²/V·s in the saturated region. This value is lower than that of the above-mentioned transistor of Example.

As apparent from the above, it is preferable, in terms of the field-effect mobility, to form the active layer such that the amorphous oxide includes the crystalline region in the vicinity of the interface with the gate insulating layer.

INDUSTRIAL APPLICABILITY

The present invention is applied to a transistor for a display device using a liquid crystal or a light emission layer such as an organic EL layer or an inorganic EL layer. Further, the transistor according to the present invention can be produced by film formation at a low temperature, and thus can be produced on a flexible substrate made of a resin, plastic, or the like. Therefore, the transistor can be suitably used for an IC card, an ID tag, and the like.

EFFECT OF THE INVENTION

According to the present invention, the transistor having a high field-effect mobility can be provided.

This application claims priority from Japanese Patent Application No. 2005-323689 filed Nov. 8, 2005, and Japanese Patent Application No. 2006-283893 field Oct. 18, 2006 which are hereby incorporated by reference herein.

The invention claimed is:

1. A field-effect transistor comprising:
    an active layer, and
    a gate insulating film,
    wherein the active layer comprises an amorphous oxide layer containing In, Zn an Ga and includes an amorphous region and a crystalline region,
    wherein the crystalline region exists in a dotted state within a distance of ½ or less of a thickness of the active layer from a first interface which is an interface between the amorphous oxide layer and the gate insulating film and within 300 nm from an interface between the active layer and the gate insulating film, or exists in a dotted state in contact with the first interface, and
    wherein the crystalline region is absent in a vicinity of a second interface opposed to the first interface.

2. A field-effect transistor according to claim 1, wherein the amorphous oxide layer has a thickness of 0.05 μm or more and 1 μm or less.

* * * * *